US012641868B2

(12) United States Patent
Murakami

(10) Patent No.: US 12,641,868 B2
(45) Date of Patent: May 26, 2026

(54) SEMICONDUCTOR DEVICE

(71) Applicant: DENSO CORPORATION, Kariya-city (JP)

(72) Inventor: Koichi Murakami, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 464 days.

(21) Appl. No.: 18/464,312

(22) Filed: Sep. 11, 2023

(65) Prior Publication Data

US 2023/0420453 A1 Dec. 28, 2023

Related U.S. Application Data

(63) Continuation of application No. PCT/JP2021/037476, filed on Oct. 8, 2021.

(30) Foreign Application Priority Data

Apr. 27, 2021 (JP) ................................. 2021-075293

(51) Int. Cl.
| | |
|---|---|
| *H10D 84/60* | (2025.01) |
| *H10D 8/00* | (2025.01) |
| *H10D 12/00* | (2025.01) |
| *H10D 62/10* | (2025.01) |

(52) U.S. Cl.
CPC ........... *H10D 84/617* (2025.01); *H10D 8/422* (2025.01); *H10D 12/481* (2025.01); *H10D 62/112* (2025.01)

(58) Field of Classification Search
CPC .... H10D 84/617; H10D 8/422; H10D 12/481; H10D 62/112; H10D 8/00; H10D 30/60; H10D 12/211; H10D 84/811; H10D 62/107; H10D 62/393; H01L 21/76
See application file for complete search history.

(56) References Cited

U.S. PATENT DOCUMENTS

| | | | |
|---|---|---|---|
| 7,635,909 B2 | 12/2009 | Mauder et al. | |
| 2015/0262999 A1 | 9/2015 | Ogura | |
| 2018/0061972 A1 | 3/2018 | Luo et al. | |
| 2019/0214379 A1 | 7/2019 | Senoo et al. | |
| 2019/0326118 A1 | 10/2019 | Naito | |
| 2020/0006538 A1* | 1/2020 | Kamibaba | ............ H10D 12/481 |

FOREIGN PATENT DOCUMENTS

JP 2014-132620 A 7/2014

\* cited by examiner

*Primary Examiner* — Mohammad A Rahman
(74) *Attorney, Agent, or Firm* — Posz Law Group, PLC

(57) ABSTRACT

A semiconductor device includes a semiconductor substrate and a lower electrode. The semiconductor substrate includes a collector region of p-type and a cathode region of n-type being in contact with the lower electrode. The semiconductor substrate has an insulated gate bipolar transistor region overlapping with the collector region when viewed along a thickness direction of the semiconductor substrate, and a diode region overlapping with the cathode region when viewed along the thickness direction of the semiconductor substrate. The semiconductor substrate further includes a buffer region of n-type being in contact with upper surfaces of the collector region and the cathode region, a drift region of n-type being in contact with an upper surface of the buffer region, and a current limiting region of p-type disposed above a boundary between the collector region and the cathode region and being in contact with an upper surface of the buffer region.

4 Claims, 8 Drawing Sheets

SEMICONDUCTOR DEVICE

CROSS REFERENCE TO RELATED APPLICATIONS

The present application is a continuation application of International Patent Application No. PCT/JP2021/037476 filed on Oct. 8, 2021, which designated the U.S. and claims the benefit of priority from Japanese Patent Application No. 2021-075293 filed on Apr. 27, 2021. The entire disclosures of all of the above applications are incorporated herein by reference.

TECHNICAL FIELD

The present disclosure relates to a semiconductor device.

BACKGROUND

Conventionally, there has been known a semiconductor device including an insulated gate bipolar transistor (IGBT) and a diode.

SUMMARY

The present disclosure provides a semiconductor device including a semiconductor substrate and a lower electrode. The semiconductor substrate includes a collector region of p-type being in contact with the lower electrode and a cathode region of n-type being in contact with the lower electrode at a position adjacent to the collector region. The semiconductor substrate has an insulated gate bipolar transistor region overlapping with the collector region when viewed along a thickness direction of the semiconductor substrate, and a diode region overlapping with the cathode region when viewed along the thickness direction of the semiconductor substrate. The semiconductor substrate further includes a buffer region of n-type being in contact with upper surfaces of the collector region and the cathode region, a drift region of n-type being in contact with an upper surface of the buffer region, and a current limiting region of p-type disposed above a boundary between the collector region and the cathode region and being in contact with an upper surface of the buffer region.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
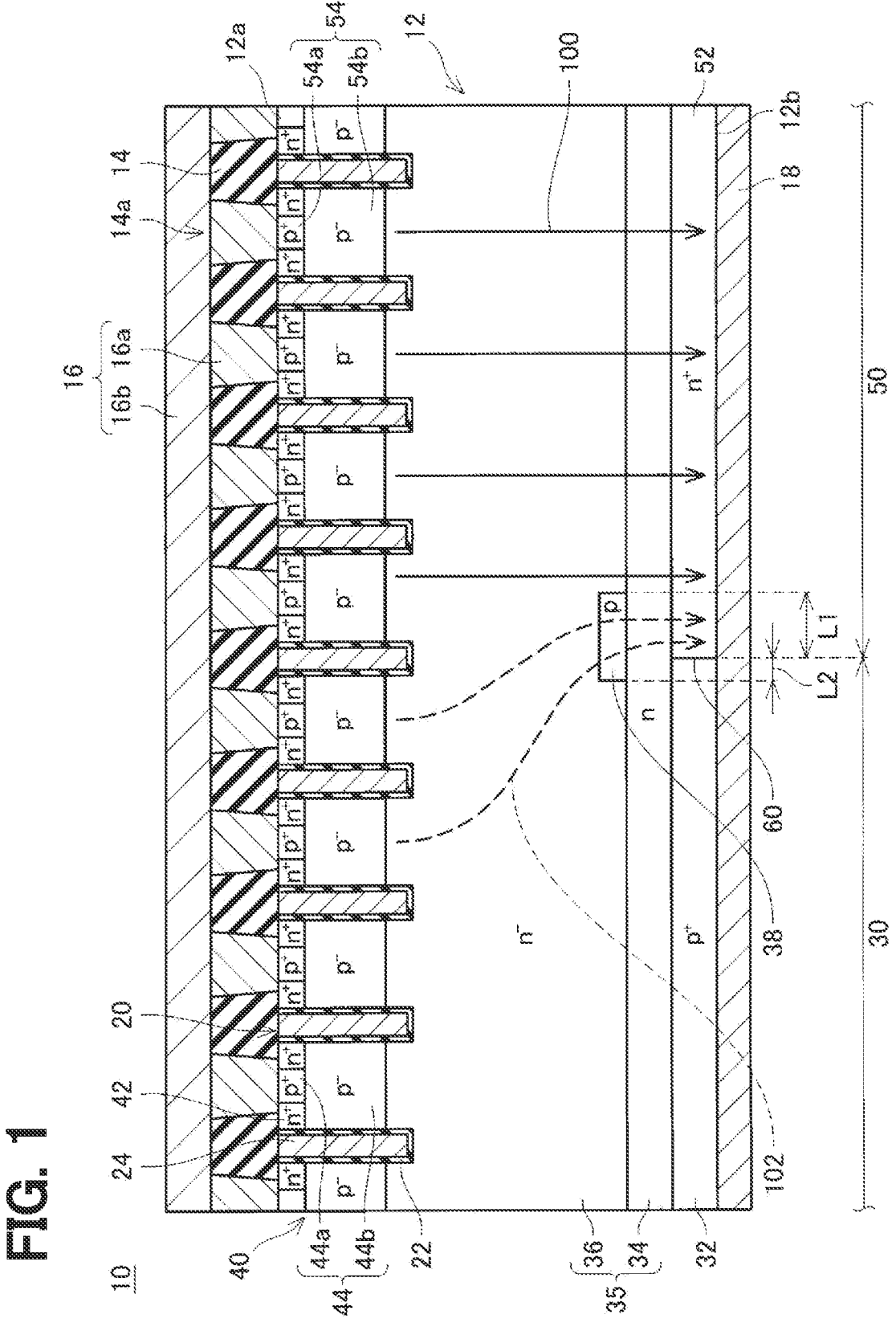
FIG. 1 is a cross-sectional view of a semiconductor device according to an embodiment.

Next, a relevant technology is described only for understanding the following embodiments. A semiconductor device according to the relevant technology includes an IGBT and a diode. A semiconductor substrate of the semiconductor device has an IGBT region and a diode region. A lower electrode is disposed on a lower surface of the semiconductor substrate. In the IGBT region, a collector region of p-type is disposed in contact with the lower electrode. In the diode region, a cathode region of n-type is disposed in contact with the lower electrode. The collector region and the cathode region are adjacent to each other. A buffer layer and a drift layer are disposed above the collector region and the cathode region. A body region of p-type and a source region of n-type are disposed in an upper portion of the IGBT region. The body region faces a gate electrode with a gate insulating film interposed therebetween. An anode region of p-type is disposed in an upper portion of the diode region. An IGBT is formed in the IGBT region, and a diode is formed in the diode region. When the IGBT operates, an upper electrode functions as an emitter electrode, and a lower electrode functions as a collector electrode. When the diode operates, the upper electrode functions as an anode electrode, and the lower electrode functions as a cathode electrode.

In the semiconductor device described above, when a potential of the upper electrode becomes higher than a potential of the lower electrode, the diode is turned on. That is, in the diode region, a current flows from the anode region toward the cathode region. At this time, holes flow from the body region in the IGBT region toward the cathode region in the diode region. That is, the holes flow across a boundary between the IGBT region and the diode region. Thereafter, when a voltage applied to the semiconductor device is inverted, holes present in the drift region flow backward and are discharged to the upper electrode. This causes a reverse recovery loss. At this time, holes present in the drift region in the vicinity of the boundary between the IGBT region and the diode region also flow backward and are discharged to the upper electrode. In this way, when holes flow backward at the boundary between the IGBT region and the diode region, a high reverse recovery loss occurs.

A semiconductor device according to an aspect of the present disclosure includes a semiconductor substrate having an upper surface and a lower surface opposite from each other, a lower electrode being in contact with the lower surface of the semiconductor substrate, a gate insulating film, and a gate electrode. The semiconductor substrate includes a collector region of p-type being in contact with the lower electrode, and a cathode region of n-type being in contact with the lower electrode at a position adjacent to the collector region. The semiconductor substrate has an insulated gate bipolar transistor region overlapping with the collector region when viewed along a thickness direction of the semiconductor substrate, and a diode region overlapping with the cathode region when viewed along the thickness direction of the semiconductor substrate. The semiconductor substrate further includes a buffer region of n-type, a drift region of n-type, a body region of p-type, a source region of p-type, an anode region of p-type, and a current limiting region of p-type. The buffer region is disposed over the insulated gate bipolar transistor region and the diode region, is in contact with an upper surface of the collector region and an upper surface of the cathode region, and has an n-type impurity concentration lower than an n-type impurity concentration of the cathode region. The drift region is disposed over the insulated gate bipolar transistor region and the diode region, is in contact with an upper surface of the buffer region, and has an n-type impurity concentration lower than the n-type impurity concentration of the buffer region. The body region is disposed within the insulated gate bipolar transistor region and is in contact with the drift region. The source region is disposed within the insulated gate bipolar transistor region and is separated from the drift region by the body region. The anode region is disposed within the diode region and is in contact with the drift region. The current limiting region is disposed above a boundary between the collector region and the cathode region, is in contact with an upper surface of the buffer region, is in contact with the drift region, and floats in an n-type region constituted by the buffer region and the drift region. The gate electrode faces the body region with the gate insulating film interposed therebetween.

In this semiconductor device, the current limiting region of p-type floats in the n-type region constituted by the buffer region and a drift region. Therefore, when the diode is in on-state, holes cannot flow from the drift region into the current limiting region. Since the current limiting region is disposed above the boundary between the collector region and the cathode region, holes are restricted from flowing into the cathode region from the drift region in the vicinity of the boundary between the collector region and the cathode region. That is, in a state where the diode is in on-state, holes are restricted from flowing to the boundary between the IGBT region and the diode region. Therefore, when a voltage applied to the semiconductor device is inverted thereafter, backflow of holes at the boundary between the IGBT region and the diode region is restricted. Therefore, in this semiconductor device, a reverse recovery loss can be restricted.

In a semiconductor device of one example of the present disclosure, the drift region may be in contact with a side surface of the current limiting region.

In a semiconductor device of one example of the present disclosure, a region of p-type floating in the n-type region constituted by the buffer region and the drift region may be only the current limiting region.

In a semiconductor device of one example of the present disclosure, a distance in a direction along the lower surface of the semiconductor substrate from the boundary between the collector region and the cathode region to a side surface of the current limiting region located above the cathode region may be 20 μm or more.

According to this configuration, the reverse recovery loss can be effectively restricted.

A semiconductor device 10 according to an embodiment of the present embodiment includes a semiconductor substrate 12 as shown in FIG. 1. A lower surface 12b of the semiconductor substrate 12 is covered with a lower electrode 18. A collector region 32 of p-type and a cathode region 52 of n-type are disposed inside the semiconductor substrate 12 in a region in contact with the lower electrode 18. Hereinafter, a region of the semiconductor substrate 12 that overlaps with the collector region 32 when viewed along a thickness direction of the semiconductor substrate 12 is referred to as an insulated gate bipolar transistor region 30 (that is, the IGBT region 30). A region of the semiconductor substrate 12 that overlaps with the cathode region 52 when viewed along the thickness direction of the semiconductor substrate 12 is referred to as a diode region 50.

An upper surface 12a of the semiconductor substrate 12 is covered with an interlayer insulating film 14. The interlayer insulating film 14 covers the upper surface 12a in a region extending over the IGBT region 30 and the diode region 50. An upper surface of the interlayer insulating film 14 is covered with an upper electrode 16. The upper electrode 16 covers the upper surface of the interlayer insulating film 14 in a region extending over the IGBT region 30 and the diode region 50. The interlayer insulating film 14 has a plurality of contact holes 14a. The contact holes 14a are provided in each of the IGBT region 30 and the diode region 50. The upper electrode 16 includes buried metal layers 16a disposed in the contact holes 14a and a surface metal layer 16b disposed on the interlayer insulating film 14. Each of the buried metal layers 16a is mainly made of tungsten. The surface metal layer 16b is mainly made of aluminum. The upper electrode 16 is in contact with the upper surface 12a of the semiconductor substrate 12 in each of the contact holes 14a.

A plurality of trenches 20 is provided from the upper surface 12a of the semiconductor substrate 12. The trenches 20 extend substantially in parallel. The trenches 20 are provided in each of the IGBT region 30 and the diode region 50. An inner surface of each of the trenches 20 is covered with a gate insulating film 22. A gate electrode 24 is disposed in each of the trenches 20. Each of the gate electrode 24 is insulated from the semiconductor substrate 12 by the gate insulation film 22. An upper surface of each of the gate electrodes 24 is covered with the interlayer insulating film 14. Each of the gate electrodes 24 is insulated from the upper electrode 16 by the interlayer insulating film 14.

The collector region 32 is a p-type region having a high p-type impurity concentration. As described above, the collector region 32 is in contact with the lower electrode 18 within the IGBT region 30. The collector region 32 is in ohmic contact with the lower electrode 18.

The cathode region 52 is an n-type region having a high n-type impurity concentration. As described above, the cathode region 52 is in contact with the lower electrode 18 within the diode region 50. More specifically, the cathode region 52 is in contact with the lower electrode 18 in a region adjacent to the collector region 32. The cathode region 52 is in ohmic contact with the lower electrode 18. A boundary 60 between the collector region 32 and the cathode region 52 coincides with a boundary between the IGBT region 30 and the diode region 50.

The semiconductor substrate 12 includes a buffer region 34, a drift region 36, a current limiting region 38, an upper p-type region 40, and a plurality of emitter regions 42.

The buffer region 34 is an n-type region having an n-type impurity concentration lower than the n-type impurity concentration of the cathode region 52. The buffer region 34 extends from the IGBT region 30 to the diode region 50. The buffer region 34 is in contact with the upper surface of the collector region 32 and the upper surface of the cathode region 52.

The drift region 36 is an n-type region having an n-type impurity concentration lower than the n-type impurity concentration of the buffer region 34. The drift region 36 extends from the IGBT region 30 to the diode region 50. The drift region 36 is in contact with an upper surface of the buffer region 34 within the IGBT region 30 and the diode region 50.

The current limiting region 38 is disposed in an n-type region 35 constituted by the buffer region 34 and the drift region 36. The entire periphery of the current limiting region 38 is surrounded by the n-type region 35. Therefore, the current limiting region 38 floats in the n-type region 35. In the n-type region 35, there is no floating p-type region other than the current limiting region 38. In other words, a region of p-type floating in the n-type region 35 is only the current limiting region 38. The current limiting region 38 is disposed above the boundary 60 between the collector region 32 and the cathode region 52. That is, the current limiting region 38 extends over the IGBT region 30 and the diode region 50. The current limiting region 38 is in contact with the upper surface of the buffer region 34. The drift region 36 is in contact with an upper surface of the current limiting region 38. That is, above the boundary 60, the current limiting region 38 is disposed on the buffer region 34, and the drift region 36 is disposed on the current limiting region 38. The drift region 36 is in contact with a side surface of the current limiting region 38. The current limiting region 38 is more widely extend in the diode region 50 than in the IGBT region 30. That is, in a direction parallel to the lower surface 12b of the semiconductor substrate 12 and orthogonal to the boundary 60, a distance from the boundary 60 to an end portion (that is, a side surface) of the current limiting region 38 located above the cathode region 52 (hereinafter, referred to as a width L1) is longer than a distance from the boundary 60 to an end portion (that is, a side surface) of the current limiting region 38 located above the collector region 32 (hereinafter, referred to as a width L2). The width L1 is greater than 20 μm.

Each of the emitter regions 42 is an n-type region and is disposed in a region including a part of the upper surface 12a of the semiconductor substrate 12. Each of the emitter regions 42 is in ohmic contact with the upper electrode 16 in the corresponding contact hole 14a. Each of the emitter regions 42 is in contact with the gate insulating film 22 on the side surface of the corresponding trench 20. In the present embodiment, the emitter regions 42 are disposed in each of the IGBT region 30 and the diode region 50. However, in other embodiments, the emitter region 42 may be omitted in the diode region 50.

The upper p-type region 40 is disposed in a region including a part of the upper surface 12a of the semiconductor substrate 12. The upper p-type region 40 extends from the IGBT region 30 to the diode region 50. Hereinafter, the upper p-type region 40 in the IGBT region 30 is referred to as a body region 44, and the upper p-type region 40 in the diode region 50 is referred to as an anode region 54.

In the IGBT region 30, the body region 44 extends from sides of the emitter regions 42 to a region below the emitter regions 42, and separates each of the emitter regions 42 from the drift region 36. The body region 44 includes a plurality of contact regions 44a and a low concentration region 44b. A p-type impurity concentration of each of the contact regions 44a is higher than a p-type impurity concentration of the low concentration region 44b. Each of the contact regions 44a is disposed in a region including a part of the upper surface 12a of the semiconductor substrate 12 on the sides of the emitter regions 42. Each of the contact regions 44a is in ohmic contact with the upper electrode 16 in the corresponding contact hole 14a. The low concentration region 44b is disposed below the contact regions 44a and the emitter regions 42. The low concentration region 44b is in contact with the gate insulating films 22 at positions below the emitter regions 42. The low concentration region 44b is in contact with the upper surface of the drift region 36.

In the diode region 50, the anode region 54 extends from the sides of the emitter regions 42 to a region below the emitter region 42, and separates each of the emitter regions 42 from the drift region 36. The anode region 54 includes a plurality of contact regions 54a and a low concentration region 54b. A p-type impurity concentration of each of the contact regions 54a is higher than a p-type impurity concentration of the low concentration region 54b. Each of the contact regions 54a is disposed in a region including a part of the upper surface 12a of the semiconductor substrate 12 on the sides of the emitter regions 42. Each of the contact regions 54a is in ohmic contact with the upper electrode 16 in the corresponding contact hole 14a. The low concentration region 54b is disposed below the contact regions 54a and the emitter regions 42. The low concentration region 54b is in contact with the gate insulating films 22 at positions below the emitter regions 42. The low concentration region 54b is in contact with the upper surface of the drift region 36.

The drift region 36 is in contact with the gate insulating films 22 at positions below the low concentration regions 44b and 54b.

In the IGBT region 30, an IGBT is formed by the emitter region 42, the body region 44, the drift region 36, the buffer region 34, the collector region 32, the gate electrode 24, the gate insulating film 22, and the like. When the IGBT is operated, a potential higher than a potential of the upper electrode 16 is applied to the lower electrode 18. When a potential equal to or higher than a gate threshold is applied to the gate electrode 24, a channel is formed in the low concentration region 44b of the body region 44, and the emitter regions 42 and the drift region 36 are connected by the channel. As a result, the IGBT is turned on, and a current flows from the lower electrode 18 toward the upper electrode 16.

In the diode region 50, a PIN diode is formed by the anode region 54, the drift region 36, the buffer region 34, and the cathode region 52. When a potential higher than the potential of the lower electrode 18 is applied to the upper electrode 16, the diode is turned on, and a current flows from the upper electrode 16 to the lower electrode 18.

The operation of the diode in the diode region 50 will be described in detail. When a potential higher than the potential of the lower electrode 18 is applied to the upper electrode 16, holes flow into the drift region 36 from the anode region 54 (that is, the contact regions 54a and the low concentration region 54b) as indicated by arrows 100 in FIG. 1. As indicated by the arrows 100, the holes flowing from the anode region 54 into the drift region 36 flow to the cathode region 52 via the buffer region 34. In this state, electrons flow from the cathode region 52 to the anode region 54 via the buffer region 34 and the drift region 36. That is, electrons flow in the opposite direction of the arrows 100. Since holes and electrons flow in this manner, a current flows from the upper electrode 16 toward the lower electrode 18 in the diode region 50. Thereafter, when the potential of the upper electrode 16 becomes lower than the potential of the lower electrode 18, the diode performs a reverse recovery operation. That is, holes present in the drift region 36 are discharged to the upper electrode 16 through the anode region 54. Therefore, a current (so-called reverse recovery current) instantaneously flows through the diode in the reverse direction. When the reverse recovery current flows in this manner, a reverse recovery loss Err occurs in the diode.

Figure 2:
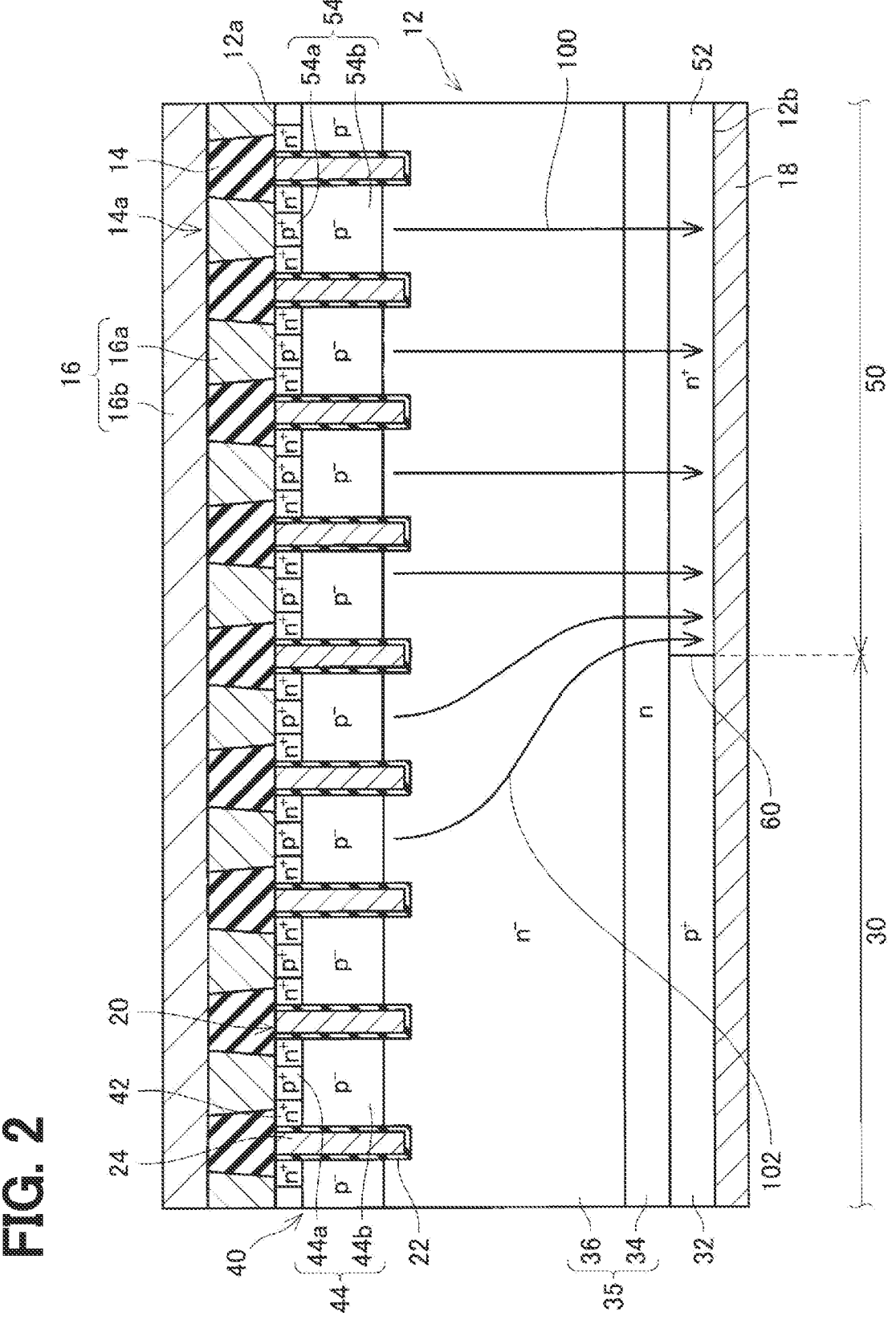
FIG. 2 is a cross-sectional view of a semiconductor device according to a comparative example.

FIG. 2 shows a semiconductor device of a comparative example. The semiconductor device of the comparative example is different from the semiconductor device of the embodiment shown in FIG. 1 in that the semiconductor device of the comparative example does not have the current limiting region 38. In the semiconductor device of the comparative example, similarly to the semiconductor device of the embodiment, holes flow in the diode region 50 as indicated by the arrows 100 when the diode is in on-state. In addition, in the semiconductor device of the comparative example, as indicated by arrows 102 in FIG. 2, when the diode is in on-state, holes flow at the boundary between the IGBT region 30 and the diode region 50. That is, when the diode is in on-state, holes flow into the drift region 36 from the body region 44 in the vicinity of the boundary between the IGBT region 30 and the diode region 50. As indicated by the arrows 102, the holes flowing from the body region 44 into the drift region 36 flow into the cathode region 52 in the vicinity of the boundary 60 via the buffer region 34. In this way, when the current limiting region 38 is not present, holes flow from the body region 44 in the IGBT region 30 to the cathode region 52 in the diode region 50. Thereafter, when the potential of the upper electrode 16 becomes lower than the potential of the lower electrode 18, the diode performs a reverse recovery operation. In the reverse recovery operation of the semiconductor device of the comparative example, similarly to the reverse recovery operation of the semiconductor device 10 of the embodiment, the reverse recovery current flows in the diode region 50. In the semiconductor device of the comparative example, holes present in the drift region 36 in the vicinity of the boundary between the IGBT region 30 and the diode region 50 (that is, holes present on paths indicated by the arrows 102) flow to the upper electrode 16 via the body region 44. That is, in the semiconductor device of the comparative example, the reverse recovery current flows not only in the diode region 50 but also in the boundary between the IGBT region 30 and the diode region 50. Therefore, in the semiconductor device of the comparative example, the reverse recovery loss Err is likely to occur.

In contrast, in the semiconductor device 10 of the embodiment shown in FIG. 1, the current limiting region 38 of p-type is disposed above the boundary 60 between the collector region 32 and the cathode region 52. Therefore, when the diode is in on-state, a pn junction at an interface between the current limiting region 38 and the drift region 36 becomes a barrier, and holes are restricted from flowing into the current limiting region 38 from the drift region 36. That is, in the semiconductor device 10 of the embodiment, the flow of holes indicated by the arrows 102 (that is, the flow of holes at the boundary between the IGBT region 30 and the diode region 50) is restricted by the current limiting region 38. Therefore, when the diode is in on-state, the number of holes present in the drift region 36 in the vicinity of the boundary between the IGBT region 30 and the diode region 50 is extremely small. Therefore, in the reverse recovery operation, the reverse recovery current flowing at the boundary between the IGBT region 30 and the diode region 50 is extremely small. Therefore, in the semiconductor device 10 of the embodiment, the reverse recovery loss Err is less likely to occur.

Figure 3:
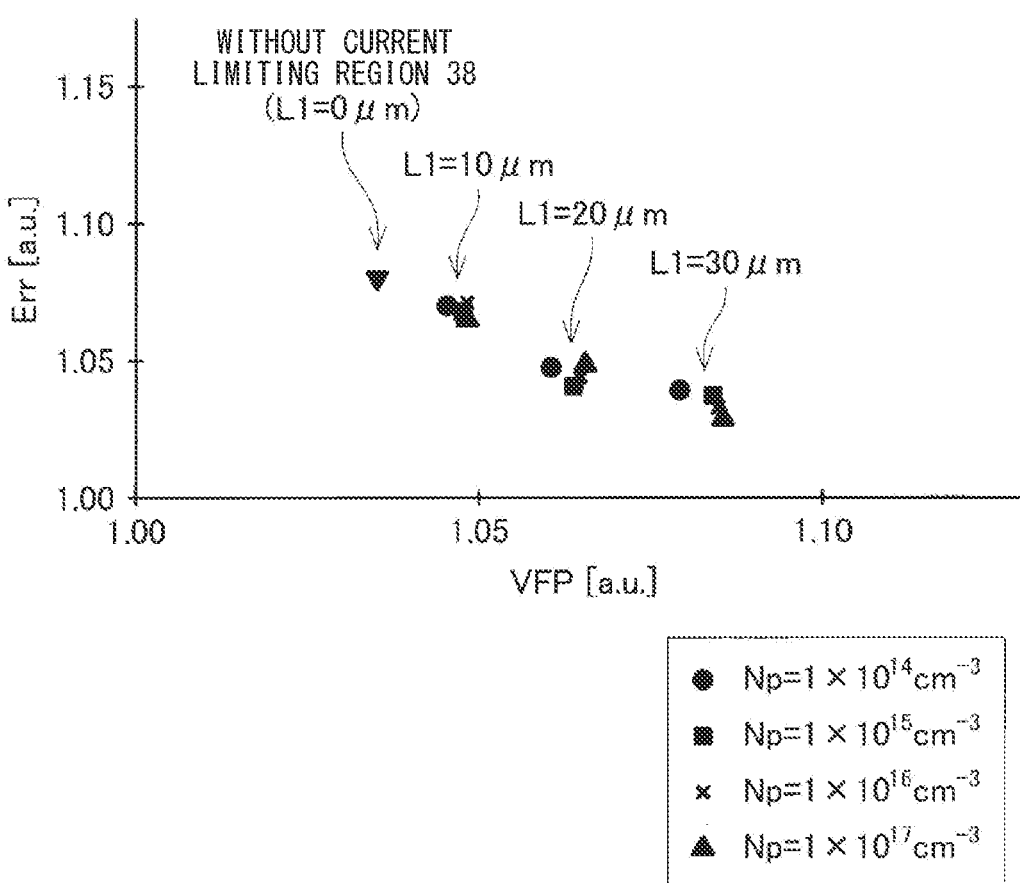
FIG. 3 is a graph showing the relationship between a width, a reverse recovery loss Err, and a forward voltage.

FIG. 3 shows results of measuring a forward voltage VFP and the reverse recovery loss Err of the diode for each sample of semiconductor devices in which the width L1 of the current limiting region 38 in the diode region 50 and the p-type impurity concentration Np of the current limiting region 38 are different from each other. As shown in FIG. 3, regardless of the p-type impurity concentration Np, the reverse recovery loss Err decreases with increase in the width L1 of the current limiting region 38. It is considered that this is because the flow of holes indicated by the arrows 102 in FIG. 1 and FIG. 2 is restricted with increase in the width L1 of the current limiting region 38. In addition, as shown in FIG. 3, regardless of the p-type impurity concentration Np, the forward voltage VFP of the diode increases with increase in the width L1 of the current limiting region 38. It is considered that this is because a region in which the current flows in the diode region 50 becomes narrower with increase in the width L1 of the current limiting region 38. As is clear from FIG. 3, the decrease amount of the reverse recovery loss Err when the width L1 is increased from 10 μm to 20 μm is larger than both the decrease amount of the reverse recovery loss Err when the width L1 is increased from 0 μm to 10 μm and the decrease amount of the reverse recovery loss Err when the width L1 is increased from 20 μm to 30 μm. Thus, by setting the width L1 to 20 μm or more, the reverse recovery loss Err can be more effectively restricted.

As described above, according to the semiconductor device 10 of the embodiment having the current limiting region 38 above the boundary 60 between the collector region 32 and the cathode region 52, the reverse recovery loss Err of the diode can be restricted.

Figure 4:
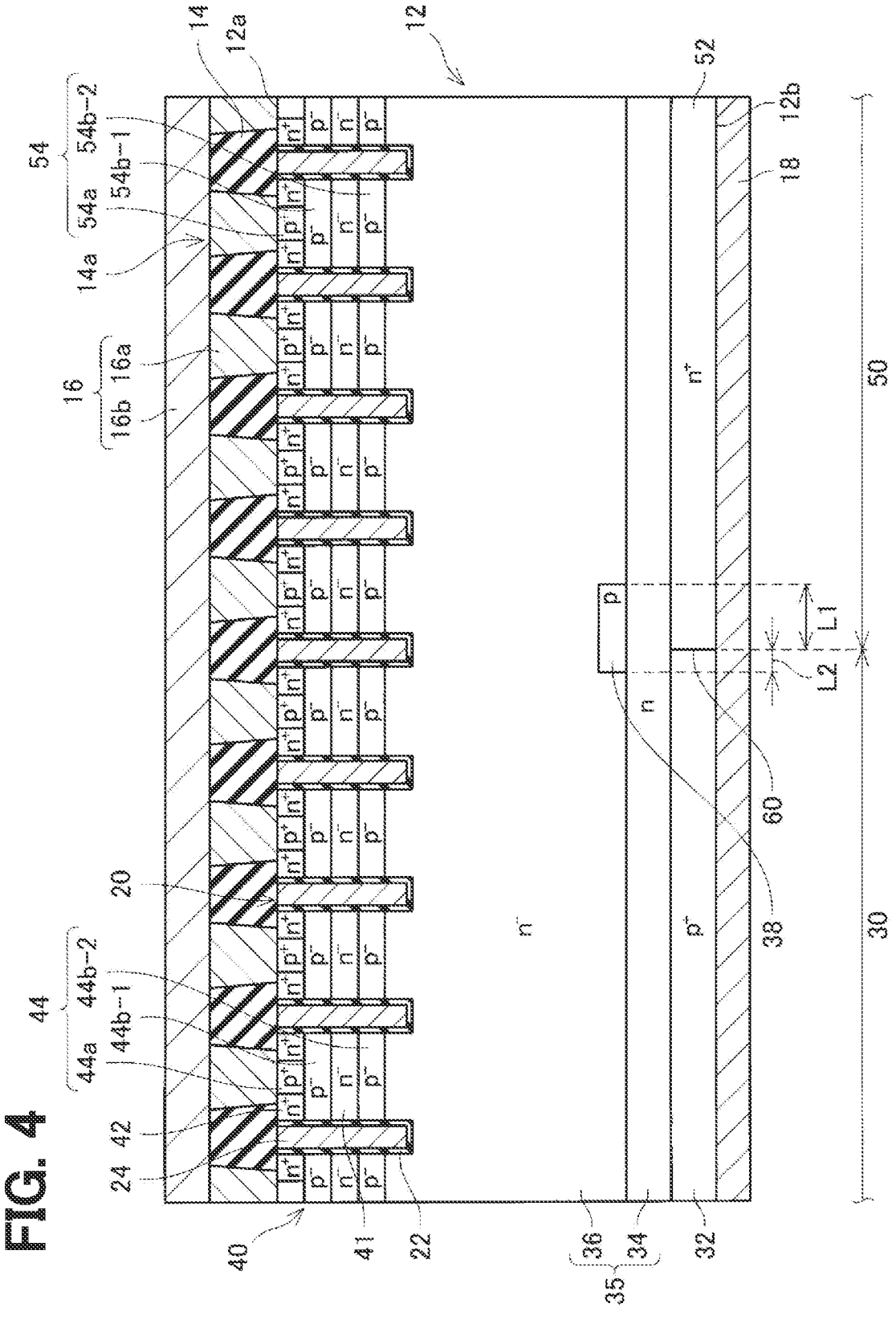
FIG. 4 is a cross-sectional view of a semiconductor device according to a first modification.

In another embodiment, as illustrated in FIG. 4, an n-type region 41 that divides the upper p-type region 40 into upper and lower regions may be provided. The low concentration region 44b is divided by the n-type region 41 into a first low concentration region 44b-1 located above the n-type region 41 and a second low concentration region 44b-2 located below the n-type region 41. Further, the low concentration region 54b is divided by the n-type region 41 into a first low concentration region 54b-1 located above the n-type region 41 and a second low concentration region 54b-2 located below the n-type region 41. Even in such a configuration, by adjusting an n-type impurity concentration of the n-type region 41, a current can flow between the first low concentration region 44b-1 and the second low concentration region 44b-2 and between the first low concentration region 54b-1 and the second low concentration region 54b-2. Therefore, the first low concentration region 44b-1 and the second low concentration region 44b-2 can function as the body region 44, and the first low concentration region 54b-1 and the second low concentration region 54b-2 can function as the anode region 54.

Figure 5:
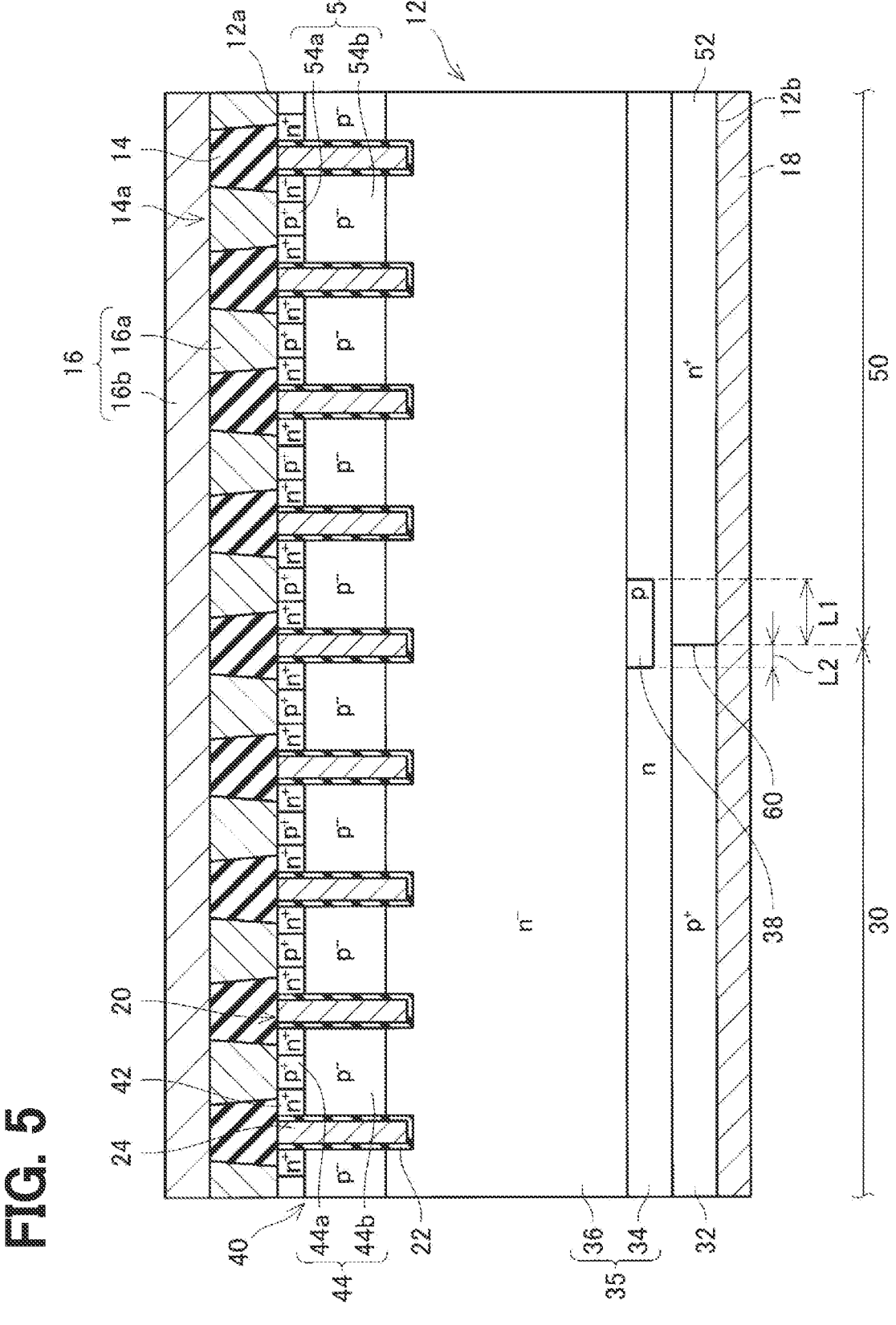
FIG. 5 is a cross-sectional view of a semiconductor device according to a second modification.

In another embodiment, as shown in FIG. 5, the buffer region 34 may be in contact with the side surfaces of the current limiting region 38. Also in this configuration, the reverse recovery loss Err can be restricted by the current limiting region 38.

Hereinafter, a configuration in which the reverse recovery current of the boundary is restricted by a region other than the current limiting region 38 will be described as first to third reference examples. That is, the semiconductor devices of the first to third reference examples do not include the current limiting region 38.

First Reference Example

Figure 6:
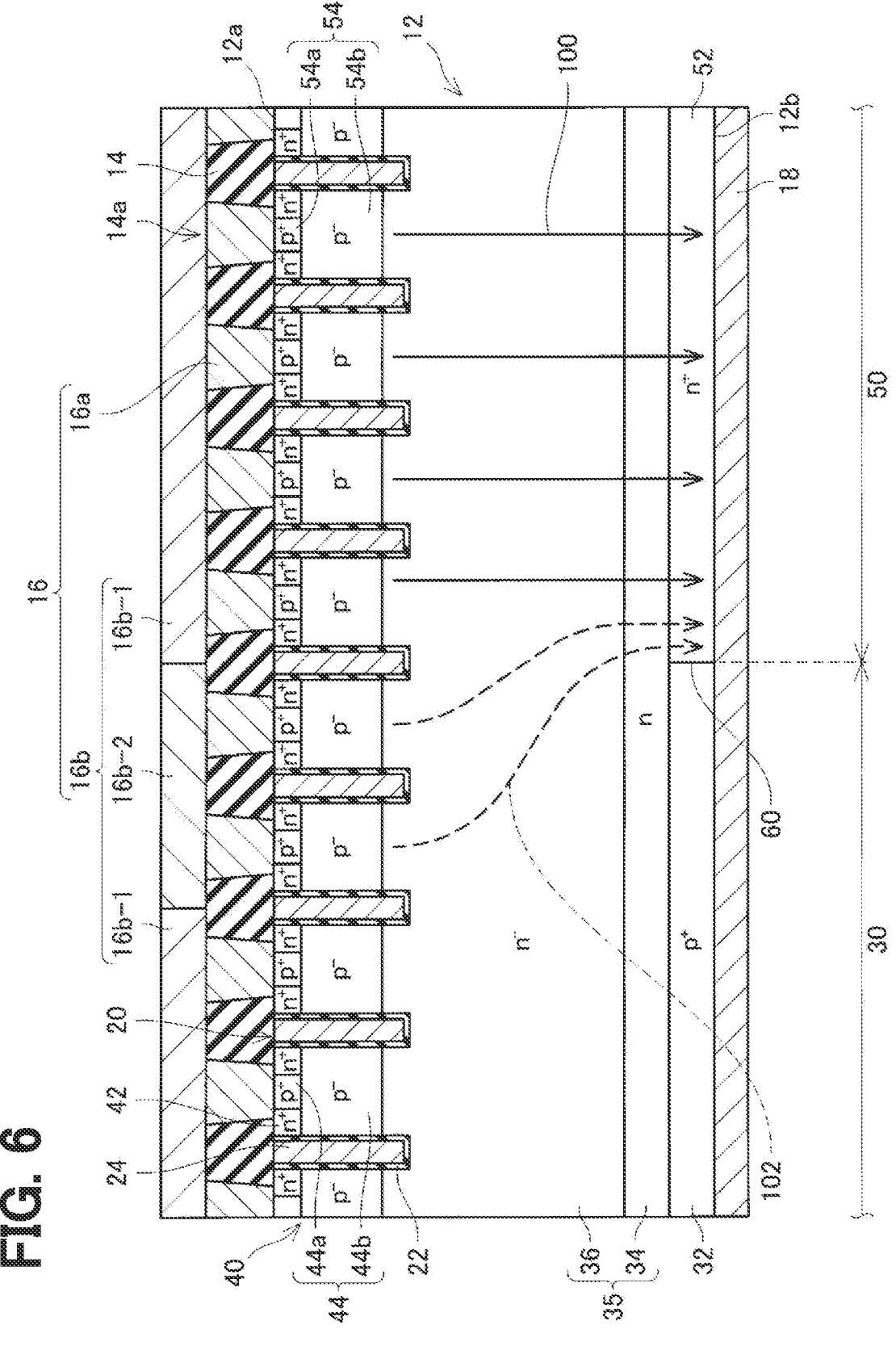
FIG. 6 is a cross-sectional view of a semiconductor device according to a first reference example.

In the semiconductor device of the first reference example illustrated in FIG. 6, a portion 16b-2 adjacent to the diode region 50 in the surface metal layer 16b in the IGBT region 30 is made of a metal having a resistivity higher than a resistivity of the other portion 16b-1. More specifically, the portion 16b-1 is made of aluminum, and the portion 16b-2 is made of a metal having a resistivity higher than a resistivity of aluminum. Therefore, when the diode is in on-state, holes are restricted from flowing in paths indicated by the arrows 102 in FIG. 6 (that is, a boundary between the IGBT region 30 and the diode region 50). Therefore, in the reverse recovery operation of the diode, the reverse recovery current can be restricted from flowing to the boundary between the IGBT region 30 and the diode region 50. Therefore, the reverse recovery loss Err can be restricted.

Second Reference Example

Figure 7:
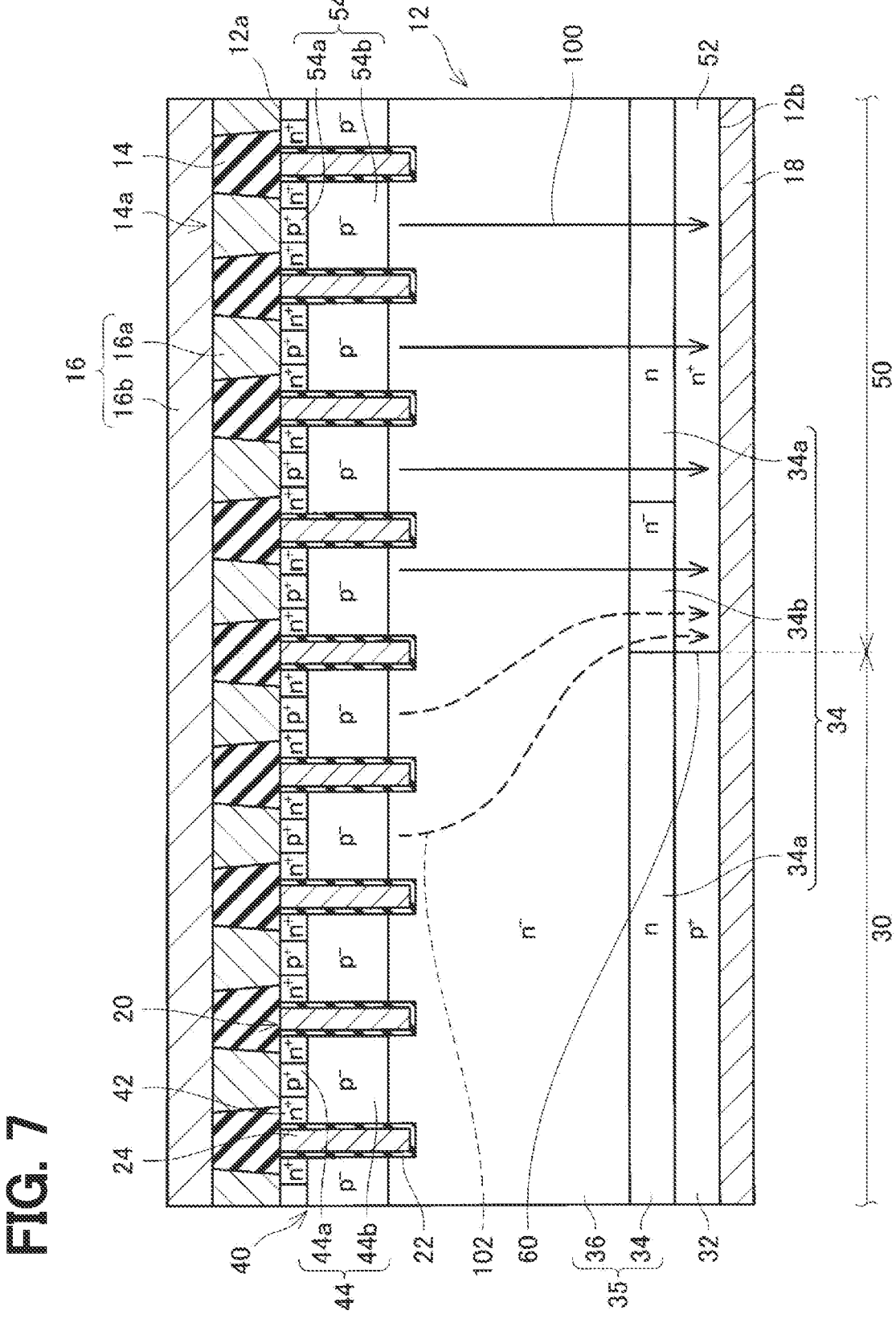
FIG. 7 is a cross-sectional view of a semiconductor device according to a second reference example.

In the semiconductor device of the second reference example illustrated in FIG. 7, the buffer region 34 includes a high concentration region 34a and a low concentration region 34b. An n-type impurity concentration of the high concentration region 40a is higher than an n-type impurity concentration of the low concentration region 40b. The low concentration region 34b is disposed in the diode region 50 at a position adjacent to the boundary 60 between the collector region 32 and the cathode region 52. The high concentration region 34a constitutes the entire buffer region 34 in the IGBT region 30 and a portion other than the vicinity of the boundary 60 of the buffer region 34 in the diode region 50. Since the n-type impurity concentration of the low concentration region 34b is lower than the n-type impurity concentration of the high concentration region 34a, a resistivity of the low concentration region 34b is lower than a resistivity of the high concentration region 34a. Therefore, when the diode is in on-state, holes are restricted from flowing in paths indicated by the arrows 102 in FIG. 7 (that is, a boundary between the IGBT region 30 and the diode region 50). Therefore, in the reverse recovery operation of the diode, the reverse recovery current can be restricted from flowing to the boundary between the IGBT region 30 and the diode region 50. Therefore, the reverse recovery loss Err can be restricted.

Third Reference Example

Figure 8:
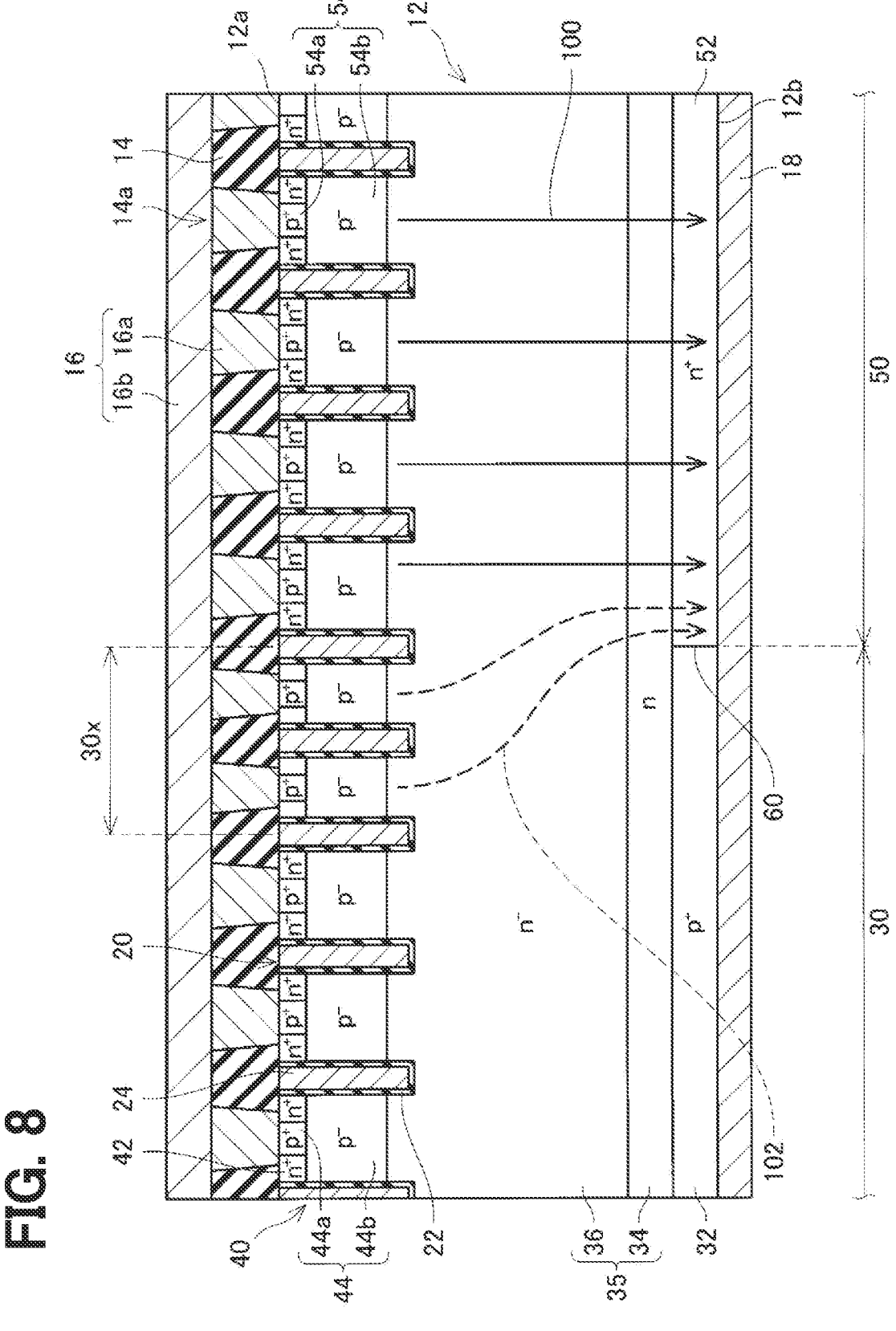
FIG. 8 is a cross-sectional view of a semiconductor device according to a third reference example.

In the semiconductor device of the third reference example illustrated in FIG. 8, in the IGBT region 30, an interval between the trenches 20 is narrower in a region 30x adjacent to the boundary between the IGBT region 30 and the diode region 50 than an interval between the trenches 20 in a region other than the region 30x. Therefore, in the region 30x, a width of the body region 44 at a portion sandwiched between the trenches 20 is narrow. Therefore, when the diode is in on-state, holes are less likely to flow into the drift region 36 from the body region 44 in the region 30x. In addition, since a width of the contact hole 14a is narrow in the region 30x, it is also possible to restrict holes from flowing into the drift region 36 from the body region 44 in the region 30x. Therefore, when the diode is in on-state, holes are restricted from flowing in paths indicated by the arrows 102 in FIG. 8 (that is, a boundary between the IGBT region 30 and the diode region 50). Therefore, in the reverse recovery operation of the diode, the reverse recovery current can be restricted from flowing to the boundary between the IGBT region 30 and the diode region 50. Therefore, the reverse recovery loss Err can be restricted.

Although the embodiments have been described in detail above, these are merely examples and do not limit the scope of claims. The techniques described in the claims include various modifications of the specific examples illustrated above. The technical elements described in the present specification or the drawings exhibit technical usefulness alone or in various combinations, and are not limited to the combinations described in the claims at the time of filing. In addition, the techniques illustrated in the present specification or drawings achieve a plurality of objectives at the same time, and achieving one of the objectives itself has technical usefulness.

What is claimed is:

1. A semiconductor device comprising:
   a semiconductor substrate having an upper surface and a lower surface opposite from each other;
   a lower electrode being in contact with the lower surface of the semiconductor substrate;
   a gate insulating film; and
   a gate electrode,
   wherein the semiconductor substrate includes:
   a collector region of p-type being in contact with the lower electrode; and
   a cathode region of n-type being in contact with the lower electrode at a position adjacent to the collector region,
   wherein the semiconductor substrate has:
   an insulated gate bipolar transistor region overlapping with the collector region when viewed along a thickness direction of the semiconductor substrate; and
   a diode region overlapping with the cathode region when viewed along the thickness direction of the semiconductor substrate,
   wherein the semiconductor substrate further includes:
   a buffer region of n-type disposed over the insulated gate bipolar transistor region and the diode region, being in contact with an upper surface of the collector region and an upper surface of the cathode region, and having an n-type impurity concentration lower than an n-type impurity concentration of the cathode region;
   a drift region of n-type disposed over the insulated gate bipolar transistor region and the diode region, being in contact with an upper surface of the buffer region, and having an n-type impurity concentration lower than the n-type impurity concentration of the buffer region;
   a body region of p-type disposed within the insulated gate bipolar transistor region and being in contact with the drift region;
   a source region of n-type disposed within the insulated gate bipolar transistor region and being separated from the drift region by the body region;
   an anode region of p-type disposed within the diode region and being in contact with the drift region; and
   a current limiting region of p-type disposed above a boundary between the collector region and the cathode region, being in contact with an upper surface of the buffer region, being in contact with the drift region, and floating in an n-type region constituted by the buffer region and the drift region, and
   wherein the gate electrode faces the body region with the gate insulating film interposed therebetween.

2. The semiconductor device according to claim 1, wherein the drift region is in contact with a side surface of the current limiting region.

3. The semiconductor device according to claim 1, wherein a region of p-type floating in the n-type region constituted by the buffer region and the drift region is only the current limiting region.

4. The semiconductor device according to claim 1, wherein a distance in a direction along the lower surface of the semiconductor substrate from the boundary between the collector region and the cathode region to a side surface of the current limiting region located above the cathode region is 20 μm or more.

\* \* \* \* \*